United States Patent [19]
Ludikhuize

[11] Patent Number: 5,610,432
[45] Date of Patent: Mar. 11, 1997

[54] SEMICONDUCTOR DEVICE WITH A FAST LATERAL DMOST PROVIDED WITH A HIGH-VOLTAGE SOURCE ELECTRODE

[75] Inventor: Adrianus W. Ludikhuize, Eindhoven, Netherlands

[73] Assignee: U.S. Philips Corporation, New York, N.Y.

[21] Appl. No.: 323,463

[22] Filed: Oct. 13, 1994

[30] Foreign Application Priority Data

Oct. 14, 1993 [BE] Belgium .............................. 09301086

[51] Int. Cl.$^6$ .................................................. H01L 23/58
[52] U.S. Cl. ........................ 257/492; 257/493; 257/495; 257/498; 257/339; 257/212; 257/488
[58] Field of Search ................................. 257/487, 490, 257/492, 493, 495, 339, 212, 498, 488

[56] References Cited

U.S. PATENT DOCUMENTS 5,347,155  9/1994  Ludikhuize .............................. 257/492

FOREIGN PATENT DOCUMENTS 0571027  11/1993  European Pat. Off. .

OTHER PUBLICATIONS

"A Versatile 700–1200–V IC Process for Analog and Switching Applications" from IEEE Trans. on Electron Devices, vol. 38, No. 7, Jul. 1991, pp. 1582–1589.

*Primary Examiner*—Jerome Jackson, Jr.
*Assistant Examiner*—John Guay
*Attorney, Agent, or Firm*—Steven R. Biren

[57] ABSTRACT

A semiconductor device of the RESURF type with a "low-side" lateral DMOST (LDMOST), comprising a semiconductor body (1) of predominantly a first conductivity type and a surface region (3) adjoining a surface (2) and of a second conductivity type. The LDMOST comprises a back gate region (5) of the first conductivity type provided in the surface region (3) with a source region (6) of the second conductivity type in the back gate region (5) and a channel region (7) defined between the source region (6) and an edge of the back gate region (5). A drain region (8) of the second conductivity type is present at a distance from the back gate region (5). A separation region (15) of the first conductivity type is provided around the LDMOST in the surface region (3), which separation region adjoins the surface (2) and extends towards the semiconductor body (1). One or several breakdown voltage raising zones (9, 99) of the first conductivity type are provided between the drain region (8) and the back gate region (5) and between the drain region (8) and the separation region (15). The surface (2) is provided with an insulating layer (17) on which a conductor track (25) is provided which is connected to the drain region (8) and which extends over the voltage raising zones (99) and the separation region (15). According to the invention, at least one zone (9A or 5) of the following zones: a zone forming the back gate region (5) and a first breakdown voltage raising zone (9A) lying between the back gate (5) and the drain region (8) and closest to the back gate region (5), is provided with at least one portion (35) projecting towards the other zone, at the area of which the distance between the two zones is smaller than in an adjoining portion of these zones, while the first breakdown voltage raising zone (9A) has no connection to a breakdown voltage raising zone (99) over which the conductor track (25) extends. An exchange of charge between the back gate region (5) and the first breakdown voltage raising zone (9A) may take place through this projecting portion (35), whereby a faster switching of the semiconductor device is facilitated, while a leakage current between back gate/source region (6, 5) and semiconductor body (1) does not occur.

7 Claims, 2 Drawing Sheets

SEMICONDUCTOR DEVICE WITH A FAST LATERAL DMOST PROVIDED WITH A HIGH-VOLTAGE SOURCE ELECTRODE

BACKGROUND OF THE INVENTION

The invention relates to a semiconductor device of the RESURF type with a low-side lateral DMOST (LDMOST), comprising a semiconductor body of predominantly a first conductivity type and a surface region which adjoins a surface, which is of a second conductivity type opposed to the first, and which forms a first p-n junction with the semiconductor body at the side facing away from the surface, which LDMOST comprises a back gate region in the form of a surface zone of the first conductivity type provided in the surface region, with a source region in the form of a surface zone of the second conductivity type in the back gate region, and a channel region defined between the source region and an edge of the back gate region, and a drain region in the form of a surface zone of the second conductivity type situated at a distance from the back gate region, while a separation region of the first conductivity type is provided in the surface region around the LDMOST so as to adjoin the surface and extend towards the semiconductor body, and one or several breakdown voltage raising zones of the first conductivity type are provided between the drain region and the back gate region and between the drain region and the separation region, which breakdown voltage raising zones adjoin the surface, this surface being provided with an insulating layer on which a conductor track is provided which is connected to the drain region and which extends over the voltage raising zones and the separation region.

The LDMOST is intended for a so-called low-side application, i.e. during operation the drain region may be at a comparatively high voltage relative to the semiconductor body and the back gate/source region, while the back gate/source region carries a comparatively low voltage relative to the semiconductor body. No breakdown voltage raising zones are present then between the back gate region and the separation region in practice.

The article "A Versatile 700-1200-V IC Process for Analog and Switching Applications" from "IEEE Trans. on Electron Devices, vol. 38, no. 7, Jul. 1991, pp. 1582–1589) discloses a device of the kind mentioned in the opening paragraph which is particularly suitable as a switching element for high voltages. An n-channel LDMOST lies in the surface region in the known device. The surface region is formed by an n-type epitaxial layer on a semiconductor body formed by a p-type semiconductor substrate. A p-type back gate and n-type source and drain regions are provided in the surface region. Gate oxide is present on the surface above the channel region. Electrical conductor tracks are provided on the source region, the back gate region and the gate oxide, forming a source/back gate connection and a gate electrode. The source and back gate regions are short-circuited. To render the semiconductor device suitable for high voltages, the so-called RESURF principle is used, i.e. the net doping of the surface region in atoms per unit surface area is so small that, when a voltage is applied across the first p-n junction, the surface region is depleted throughout its thickness at least locally before breakdown occurs. As a pilot value for the net doping, approximately $1\times10^{12}$ atoms/cm$^2$ is taken in the case of RESURF. In the known semiconductor device, one or several breakdown voltage raising zones are provided between the back gate and drain regions and between the drain region and the separation region, these zones taking the form of one or several rings extending around the drain region. The breakdown voltage raising zones ensure that, given a high voltage at the drain connection relative to the back gate and the substrate, the surface region is depleted not only from the first p-n junction between substrate and epitaxial layer, but also from p-n junctions between the breakdown voltage raising zones and the epitaxial layer. The epitaxial layer is thus depleted from several sides, so that even at a doping concentration of the surface region higher than approximately $1\times10^{12}$ atoms/cm$^2$, for example approximately $1.5\times10^{12}$ atoms/cm$^2$, the RESURF condition can be fulfilled: the epitaxial layer can be completely depleted at least locally before avalanche breakdown occurs between substrate and back gate. The breakdown voltage raising zones here spread the electric field in the surface region, so that no high electric fields occur locally. The channel region is present at the surface below the gate oxide. Charge carriers from the channel region must pass below the breakdown voltage raising zones through the so-called drift region to the drain. A breakdown voltage raising zone which lies too close to the back gate region blocks the charge carriers coming from the channel region. This is why in an LDMOST a region between back gate and drain adjoining the surface and the back gate region is kept free from breakdown voltage raising zones.

When the voltage at the drain region increases in an n-channel LDMOST after switching-off of the LDMOST, the breakdown voltage raising zones will follow the drain region as regards voltage until punch-through to the p-n junction between back gate and surface region charges the breakdown voltage raising zones negatively and said zones are depleted at least partly. When the drain voltage decreases now after switching-on of the LDMOST, the breakdown voltage raising zones cannot be discharged through the blocked p-n junctions and accordingly remain negatively charged for some time, which is accompanied by a high ON-resistance (resistance between drain and source) of the LDMOST because a portion of the surface region between back gate and drain, i.e. the drift region, remains partly depleted. This high ON-resistance remains until holes are supplied from the p-n junction between the back gate and the surface region, for example, by leakage or punch-through.

SUMMARY OF THE INVENTION

The invention has for its object inter alia to provide an LDMOST which exhibits no or substantially no increase in the ON-resistance when being switched on.

According to the invention, the device is for this purpose characterized in that at least one of the following zones: a zone forming the back gate region and a first breakdown voltage raising zone situated between the back gate and drain regions and situated most closely to the back gate region, is provided with at least one portion projecting towards the other zone at the area of which the distance between the two zones is smaller than in an adjoining portion of these zones, while the first breakdown voltage raising zone has no connection to a breakdown voltage raising zone over which the conductor track extends.

In the known semiconductor device, the first breakdown voltage raising zone lies between the back gate and-drain regions at a comparatively great distance from the back gate region so as not to block charge carriers from the channel region. According to the invention, the distance between the back gate region and the first breakdown voltage raising zone is reduced locally at projecting portions. Owing to the smaller distance, charge can be supplied or removed more easily. For example, when the drain voltage decreases after switching-on of an n-channel LDMOST, the first breakdown voltage raising zone is provided with holes through the projecting portion so that the potential of the first zone can rise quickly. Since the distance between the back gate region and the first breakdown voltage raising zone is greater outside the projecting portions than at the areas of the projecting portions, charge carriers can flow from the channel region to the drain region around the projecting portions. The other breakdown voltage raising zones may lie so close together that a comparatively easy charge transport from the first zone to further zones is possible, so that the potentials of these zones can establish themselves quickly.

It is noted that the old European Patent Application no. 93201378 not previously published discloses a semiconductor device in which one of the following zones: a zone forming the back gate region and a first breakdown voltage raising zone situated between the back gate and drain regions and most closely to the back gate region, is provided with at least one portion projecting towards the other zone at the area of which the distance between the two zones is smaller than in an adjoining portion of these zones.

Although this semiconductor device has no or substantially no increase in the ON-resistance during switching-on, it is found in practice that the use of said projecting portions under special circumstances, especially in so-called low-side applications in which a high voltage may be present at the drain region as compared with the semiconductor body and the back gate/source region, leads to problems involving leakage currents between semiconductor body and back gate/source region. This renders the semiconductor device less suitable in an application in which a certain voltage drop is desired between back gate/source region and semiconductor body.

The invention further has for its object to provide a low-side LDMOST which has no or substantially no increase in its ON-resistance during switching-on and which has no leakage current between back gate/source region and semiconductor body.

According to the invention, the first breakdown voltage raising zone which lies between the back gate and the drain region and which lies closest to the back gate region has no connection to a breakdown voltage raising zone over which the conductor track extends. It is found that the leakage current between back gate/source region and semiconductor body is then strongly reduced or indeed eliminated. It is suspected that the following effects play a part. A high voltage on the conductor track connected to the drain region causes a comparatively strong electric field in the insulating layer and in the surface region below the conductor track. This electric field locally causes a kind of breakdown in the surface layer, whereby charge is incorporated in the insulating layer, counteracting the electric field caused by the voltage. This charge remains present also when the voltage at the conductor track is no longer present. This charge now induces an inversion channel at the surface below the conductor track in the surface region. Since the conductor track extends over the separation region and voltage raising zones, said inversion channel short-circuits the separation region with the voltage raising zones below the conductor track. In practice, the voltage raising zones are rings which run around the drain region. The voltage raising zones between back gate and drain region then continue below the conductor track. Since leakage currents are possible between and in the voltage raising zones, and since charge transport is possible between the voltage raising zone adjoining the back gate region and the back gate region itself via the projecting portion, the back gate region will also be electrically connected to the inversion channel. The source region is short-circuited with the back gate region, so that the source region is then connected to the separation region, and thus to the semiconductor body via the voltage raising zones and the inversion channel. A leakage current can then flow between the source region and the semiconductor body. If the first breakdown voltage raising zone situated between the back gate and the drain region, and closest to the back gate region, has no connection to a breakdown voltage raising zone over which the conductor track extends, then no leakage current between source region and semiconductor body can occur through this zone. Accordingly, the leakage current is strongly reduced or even prevented.

A second embodiment suitable for applications in which the voltage at the conductor track to the drain region becomes comparatively high is characterized in that all breakdown voltage raising zones situated between the back gate and the drain region have no connection to a breakdown voltage raising zone over which the conductor track extends. At higher voltages on the conductor track, charges are induced in the insulating layer above voltage raising zones over a wider area, i.e. farther away from the separation region. In that case several or all voltage raising zones below the conductor track are short-circuited by the inversion channel. A leakage current may then nevertheless flow owing to charge transport between the first breakdown voltage raising zone and further breakdown voltage raising zones, even if the first voltage raising zone is not connected to voltage raising zones below the conductor track. When all breakdown voltage raising zones between back gate and drain region have no connection to breakdown voltage raising zones below the conductor track, however, a connection of portions of the breakdown voltage zones below the conductor track to further portions of the breakdown voltage raising zones is broken, so that no leakage currents can occur between the source region and the semiconductor body.

In a further embodiment, the lateral distance between a breakdown voltage raising zone lying between the back gate and the drain region and a breakdown voltage raising zone over which the conductor track extends is more than 5 µm, preferably 10 µm. It is found in practice with such a distance that no or strongly reduced leakage currents occur.

Preferably, a dielectric insulating layer and a conductive field plate are provided on the surface between a breakdown voltage raising zone situated between the back gate and the drain region and a breakdown voltage raising zone over which the conductor track extends, which field plate is electrically connected to the source region or to a gate electrode present above the channel region. It is found in practice that the leakage current is even further reduced then.

It is found in practice that the charge induced in the insulating layer is present not only perpendicularly below the conductor track, but also extends in lateral direction. Preferably, the lateral distance from a breakdown voltage raising zone situated between the back gate and the drain region to an adjacent edge of the conductor track is more than 5 µm. With such a distance, there is no connection between a breakdown voltage raising zone situated between the back gate and the drain region and the inversion channel, so that no or strongly reduced leakage currents occur.

Preferably, the insulating layer comprises silicon oxide. Problems with leakage currents are found to occur in particular when silicon oxide is used for the insulating layer.

The measure according to the invention renders it possible nevertheless to use a tried and tested material such as silicon oxide without leakage currents occurring in the semiconductor device.

BRIEF DESCRIPTION OF THE DRAWING

The invention will be explained in more detail below by way of example with reference to an embodiment and the annexed diagrammatic drawing, in which.

The Figures are purely diagrammatic and not drawn to scale. Corresponding parts have been generally given the same reference numerals in the Figures. In the plan view of FIG. 1, a wiring pattern has only been indicated for the drain region and for a field plate to keep the drawing clear.

DESCRIPTION OF THE PREFERRED EMBODIMENTS

Figure 1:
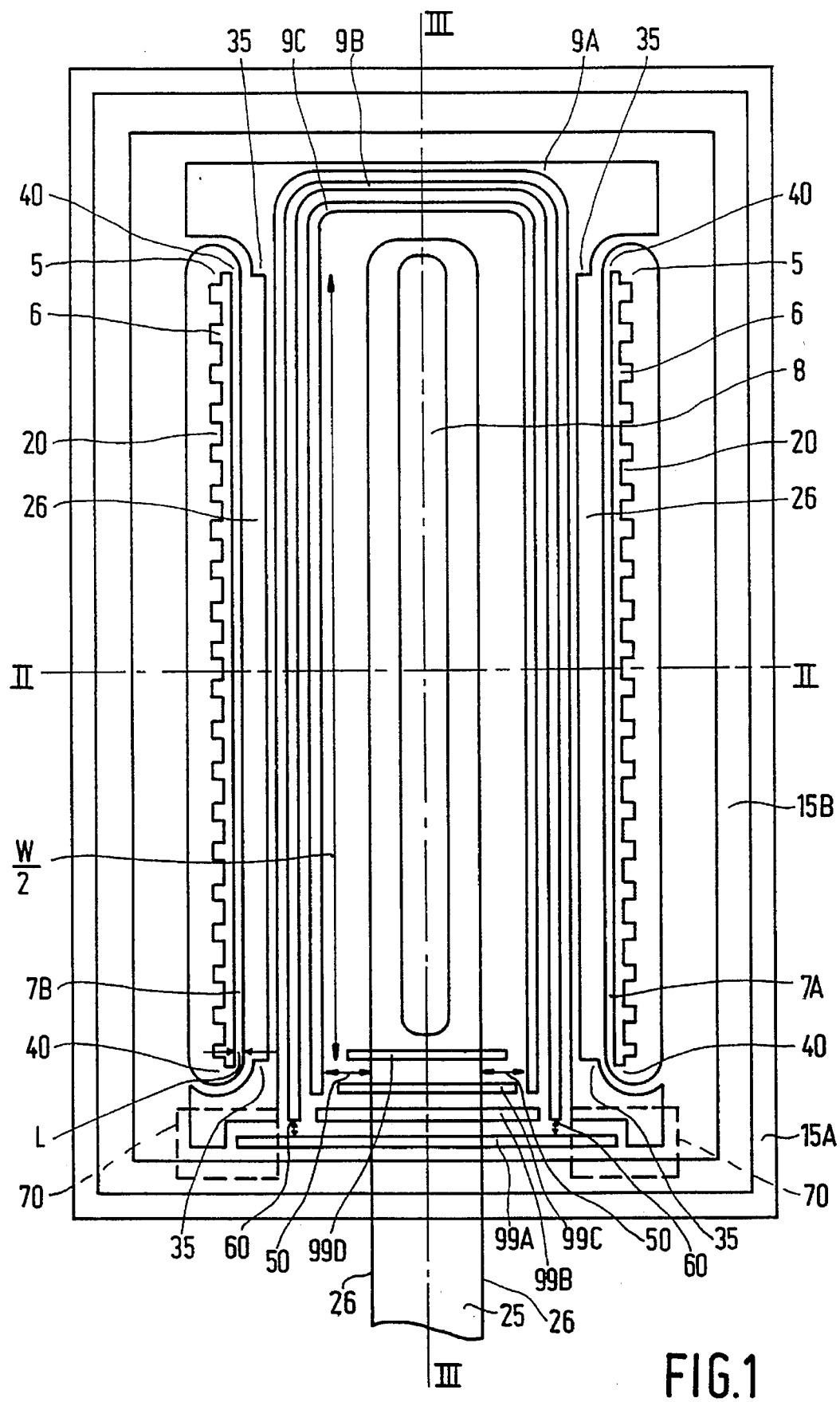
FIG. 1 is a plan view of a semiconductor device according to the invention.
Figure 2:
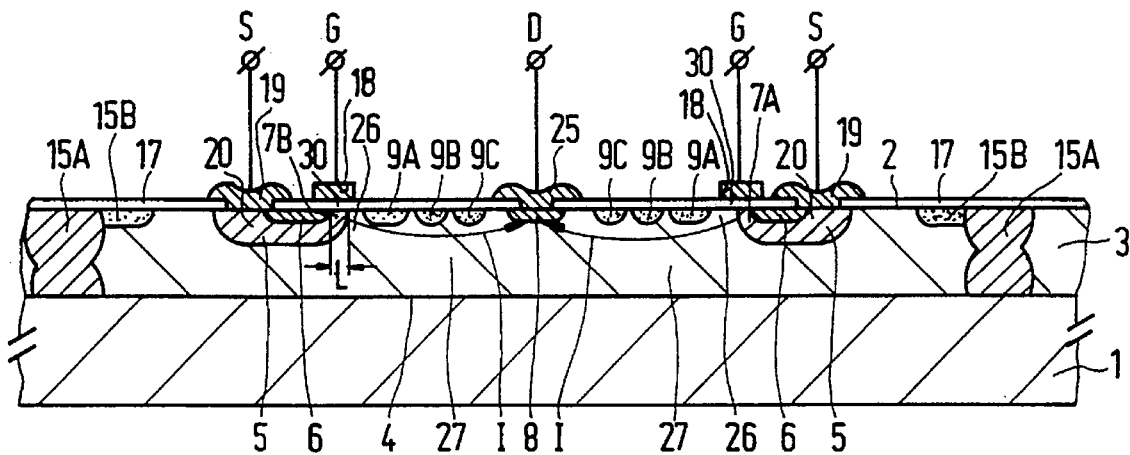
FIG. 2 is a cross-section taken on the line II—II of the semiconductor device shown in FIG. 1.
Figure 3:
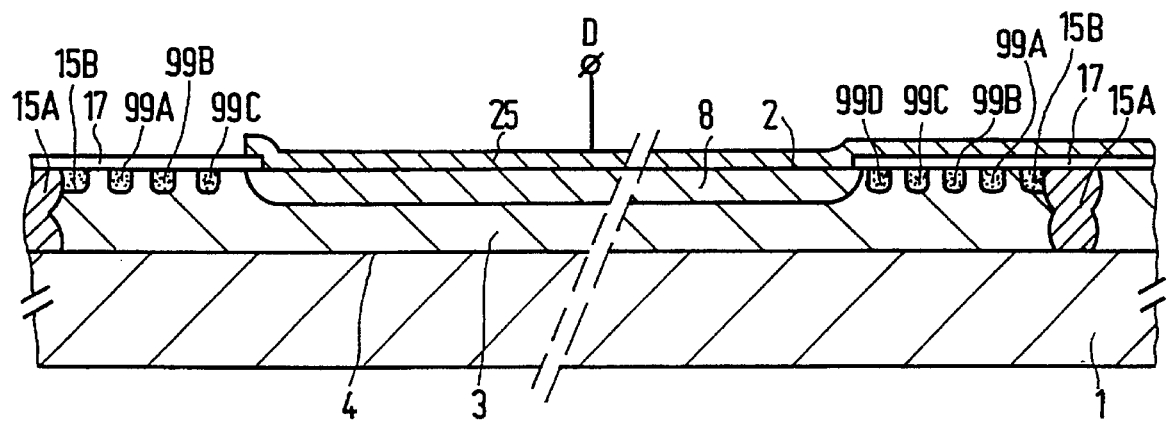
FIG. 3 is a cross-section taken on the line III—III of the semiconductor device shown in FIG. 1.

FIG. 1 is a plan view and FIGS. 2 and 3 are two cross-sections taken on the lines II—II and III—III in FIG. 1, respectively, of a semiconductor device according to the invention. The semiconductor device of the RESURF type with a low-side lateral DMOST (LDMOST) comprises a semiconductor body 1 of predominantly a first conductivity type and a surface region 3 of a second conductivity type opposed to the first and adjoining a surface 2. The side of the surface region 3 facing away from the surface forms a first p-n junction 4 with the semiconductor body 1. The LDMOST comprises a back gate region 5 which is provided in the surface region 3 and takes the shape of a surface zone of the first conductivity type, with a source region 6 in the form of a surface zone of the second conductivity type in the back gate region 5. The LDMOST further comprises a channel region 7 defined between the source region 6 and an edge of the back gate region 5 and a drain region 8 in the form of a surface zone of the second conductivity type which is at a distance from the back gate region 5. A separation region 15 of the first conductivity type adjoining the surface 2 and extending to the semiconductor body 1 is provided in the surface region 3 around the LDMOST. The separation region 15 comprises a heavily doped zone 15A and adjoining thereto and to the surface 2 an extension zone 15B of the same doping type, but with a lower doping level than the zone 15A. The extension region 15B reduces the electric field near the zone 15A. One or several breakdown voltage raising zones 9, 99 of the first conductivity type are provided between the drain region 8 and the back gate region 5 and between the drain region 8 and the separation region 15, which breakdown voltage raising zones 9, 99 adjoin the surface 2. The LDMOST is intended for a so-called low-side application in which the drain region 8 may have a comparatively high voltage relative to the semiconductor body 1 and the back gate/source region 5, 6 during operation, whereas the back gate/source region 5, 6 is at a comparatively low voltage relative to the semiconductor body 1. No breakdown voltage raising zones 9, 99 are then present in practice between the back gate region 5 and the separation region 15, as is indicated in FIG. 1.

In general, the total net doping of the second conductivity type per unit surface area of the surface region 3, at least between the drain region 8 and the back gate region 5, is sufficiently low so that the surface region is depleted throughout its thickness at least locally before breakdown occurs when a voltage is applied across the first p-n junction 4. When the surface region 3 is depleted also from the breakdown voltage raising zones 9, 99 and from a p-n junction between the back gate region 5 and the surface region 3, as in the present example, the net doping of the surface region 3 can be chosen to be higher than if depletion were to take place from the first p-n junction 4 only. The surface 2 is provided with an insulating layer 17 on which a conductor track 25 is provided connected to the drain region 8 and extending over the voltage raising zones 99 and the separation region 15. This conductor track 25 connects the drain region 8 to, for example, further parts of the semiconductor device or to a connection pad. A dielectric layer 30, the gate oxide, is present above the channel region 7. An electrical conductor 18 forming the gate electrode is present on the gate oxide, in this example a strongly doped polysilicon conductor. A contact window is provided in the oxide layer 17 above the source region 6 and the back gate region 5. An electrical conductor 19, in this example an aluminium conductor, is provided in this contact window. The back gate and source regions 5 and 6 are so shaped that the source region 6 is completely surrounded by the back gate region 5 (see FIGS. 1 and 2), while portions 20 of the back gate region 5 adjoin the surface 2 locally within the source region 6 (see FIGS. 1 and 2). The contact window is then partly above the source region 6 and above the portions 20 of the back gate region 5 (see FIG. 2). The electrical conductor 19 thus short-circuits the back gate and source regions. Such a geometry of back gate 5 and source region 6 is very compact, while the short-circuiting is very effective. The LDMOST shown in FIG. 1 has a drain region 8 surrounded by the voltage raising zones 9, while back gate regions 5 provided with channels 7A, 7B are present symmetrically on two sides of the drain region 8. In an LDMOST, a region 26 between the back gate and drain regions and adjoining the surface 2 and the back gate region 5 must remain free from breakdown voltage raising zones 9 because charge carriers coming from a conduction channel 7, which may be at the surface 2 below the gate oxide 30, must be capable of passing through the region 26 to the drain region 8.

An n-channel LDMOST is described as an example of a semiconductor device according to the invention. A p-type silicon substrate is used here as the semiconductor body 1 with a doping concentration of $1.5 \times 10^{14}$ atoms/cm$^3$ (specific resistance approximately 90 µm). The surface area 3 comprises an n-type layer epitaxially provided on the semiconductor body 1 with a doping concentration of $7 \times 10^{14}$ atoms/cm$^3$ and a thickness of 25 µm (specific resistance approximately 6 Ω.cm). The back gate region 5 has a p-type doping concentration of $1 \times 10^{14}$ atoms/cm$^2$ and the source region 6 and the drain region 8 have an n-type doping of $9 \times 10^{15}$ atoms/cm$^2$. The breakdown voltage raising zones have a p-type doping of $2 \times 10^{12}$ atoms/cm$^2$. The heavily doped zone 15A of the separation region 15 has a p-type doping of $1 \times 10^{16}$ atoms/cm$^2$, and the extension zone 15B a p-type doping of $2 \times 10^{12}$ atoms/cm$^2$. The width W of the channel region 7 is approximately 1 min. Because of the symmetry of the LDMOST of FIG. 1, this width W is composed of two portions of approximately 0.5 mm each. The back gate region 5 has dimensions of 0.5 mm×20 µm, the drain region 8 of 0.5 mm×16 µm (see FIG. 1). The distance between back gate regions 5 and the drain region 8 is approximately 70 μm. The first breakdown voltage raising zone 9A lies at a distance of more than 10 μm from the back gate region 5, in this example 14 μm. Given such a distance, the current I of electrons from the conduction channel 7 can be sent through the drift region 27 to the drain 8 along the breakdown voltage raising zones 9 practically unhampered. The interspacings between the voltage raising rings are approximately 3 μm. The conductor track 25 is made of aluminium.

Such a semiconductor device is highly suitable as a high-voltage device, for example, in a video output amplifier. A quick response time in combination with a low static dissipation is often desired in high-voltage semiconductor devices. This means that the LDMOST must be capable of fast switching and the drift region must not have too high a resistance, i.e. the doping level of the surface region 3 must not be too low.

Problems may arise in a known semiconductor device during switching of the LDMOST as a result of the breakdown voltage raising zones 9 which are situated in an active portion of the LDMOST between back gate 5 and drain 8. When the drain-source voltage $V_{ds}$ between the drain region 8 and the source region 6 increases in an n-channel LDMOST after switching-off of the LDMOST, the breakdown voltage raising zones 9 will follow the drain region 8 in its voltage until holes are discharged by punch-through to the p-n junction between back gate 5 and surface region 3, whereby the breakdown voltage raising zones 9 are negatively charged and are at least partly depleted. After switching-on of the LDMOST, the drain-source voltage $V_{ds}$ assumes a low value. The charged breakdown voltage raising zones 9 are then at a negative voltage. The breakdown voltage raising zones 9 cannot be discharged through the blocked p-n junctions and accordingly remain negatively charged for some time, which is accompanied by a high ON-resistance (resistance between drain 8 and source 6) of the LDMOST, because a portion of the surface region 3 between back gate 5 and drain 8, the so-called drift region 27, remains depleted. This high ON-resistance remains until holes are supplied by punch-through from the p-n junction between the back gate region 5 and the surface region 3. According to the invention, at least one of the zones: the zone forming the back gate region 5 and a first breakdown voltage raising zone 9A situated between back gate 5 and drain region 8 and closest to the back gate region 5, is provided with at least one portion 35 projecting towards the other zone where the distance between the two zones is smaller than in an adjoining portion of these zones, while the first breakdown voltage raising zone 9A has no connection to a breakdown voltage raising zone 99 over which the conductor track 25 extends.

Charge carriers in the MOST must be capable of moving from source 6 to drain 8 through the channel region 7, which extends directly below the surface 2. In order to move from the channel region 7 to the drain 8, the charge carriers must pass below the breakdown voltage raising zones 9 through the drift region 27 (current I in FIG. 2). The first breakdown voltage raising zone 9A accordingly lies at a comparatively great distance from the back gate region 5 in practice so as not to block the flow of charge carriers. According to the invention, the distance between back gate region 5 and the first breakdown voltage raising zone 9A is reduced locally at projecting portions 35. Owing to the smaller distance, charge may be supplied or removed more easily. For example, when the drain-source voltage $V_{ds}$ decreases after switching-on of an n-channel LDMOST, the first breakdown voltage raising zone 9A is provided with holes through the projecting portion 35, so that the potential of the first zone 9A can rise quickly. Since the distance between the back gate region 5 and the first breakdown voltage raising zone 9A is greater outside the projecting portions 35 than at the areas of the projecting portions 35, charge carriers can flow from the channel region 7 to the drain region 8 outside the projecting portions (see FIG. 2, current I). The remaining breakdown voltage raising zones 9B, 9C may lie so close together and to zone 9A that a comparatively easy charge transport from the first zone 9A to further zones 9B, 9C is possible, so that the potentials of these zones can establish themselves.

A high-voltage semiconductor device usually has an elongate channel region 7 with a width W which is greater than the length L of the channel region. In such a semiconductor device, the projecting portion 35 is preferably situated near a narrow end 40 of the channel region 7. The width W of the channel 7 is then practically not reduced. It is in addition possible to choose the width of the projecting potion 35 to be comparatively great. In the semiconductor device of FIG. 1, the entire narrow end of the back gate region 5 is used for forming the projecting portion 35, so that a good exchange of charge between back gate 5 and the first breakdown voltage raising zone 9A is possible. Strong electric fields may occur locally owing to curvature of the p-n junction between back gate 5 and surface region 3 at the area of the narrow end of the back gate region 5. An additional advantage of projecting portions 35 at the narrow end of the channel region 7 is that adverse effects such as local breakdown can also be suppressed by means of the projecting portion 35. The projecting portion 35 in this case blocks the transport of charge carriers from the channel 7 at the narrow end of the back gate region 5. In this example, the distance between the voltage raising zone 9A and the back gate region at the area of the projecting portion 35 is 3 μm.

It is noted that the old European Patent Application no. 93201378 not previously published discloses a semiconductor device in which either the back gate region 5 or the first breakdown voltage raising zone 9A lying closest to the back gate region 5 is provided with a projecting portion 35 at the area of which the distance between the back gate region 5 and the zone 9A is smaller than elsewhere. Reference is made to said European Patent Application no. 93201378 for a description of various embodiments of the projecting portion 35, for example, as a fixed connection between zone 9A and back gate region 5. Although this semiconductor device exhibits no or substantially no increase in the ON-resistance upon switching-on, it appears in practice with the use of said projecting portions 35 under special circumstances, in particular in so-called low-side applications where a high voltage may be present at the drain region 8 compared with the semiconductor body 1 and the back gate/source region 6, 5, that problems involving leakage currents between the semiconductor body 1 and back gate/source regions 6, 5 arise. This renders the semiconductor device less suitable in an application in which a certain voltage drop is desired between the back gate/source region 6, 5 and the semiconductor body 1.

According to the invention, furthermore, the first breakdown voltage raising zone 9A situated between the back gate 5 and the drain region 8 and closest to the back gate region 5 has no connection to a breakdown voltage raising zone 99 over which the conductor track 25 extends. In the example of FIG. 1, a breakdown voltage raising zone running around the drain region in the form of a ring is interrupted on either side of the conductor track. The leakage current is found to be strongly reduced or entirely absent in that case. When a high positive voltage is applied to the conductor track 25 connected to the drain region 8 in a semiconductor device with an n-channel LDMOST, this voltage causes a comparatively strong electric field in the insulating layer 17 and in the surface region 3 below the conductor track 25. This electric field locally causes a kind of breakdown in the surface layer 3, whereby negative charge is incorporated into the insulating layer 17, counteracting the electric field caused by the voltage. This negative charge remains also when the voltage at the conductor track 25 is no longer present. Now this negative charge induces an inversion channel of holes at the surface 2 in the surface region 3 below the conductor track 25. Since the conductor track 25 extends over the separation region 15 and voltage raising zones 99, all of which regions are of the p-type, said inversion channel short-circuits the separation region 15 with the voltage raising zones 99. When the breakdown voltage raising zone 9A, connected to the back gate region 5 through the projecting portion 35, extends to below the conductor track 25, the back gate region 5, and thus also the source region 6 will be electrically connected to the inversion channel formed. The back gate/source region 5, 6 is then connected to the separation region 15, and thus to the semiconductor body 1, through the inversion channel so that a leakage current can flow between the back gate/source region 5, 6 and the semiconductor body 1. Owing to the measure according to the invention, the breakdown voltage raising zone 9A which is connected to the back gate region 5 through projecting portion 35 has no connection to a breakdown voltage raising zone 99 below the conductor track 25. No charge transport from the inversion channel to the breakdown voltage raising zone 9A can take place then. The leakage current is strongly reduced or even completely prevented.

A second embodiment suitable for applications in which the voltage at the conductor to the drain region becomes comparatively high is sketched in FIGS. 1, 2 and 3. In this embodiment, all breakdown voltage raising zones 9 situated between the back gate 5 and the drain region 8 have no connection to a breakdown voltage raising zone 99 over which the conductor track 25 extends. With the conductor track 25 at higher voltages, charges are induced in the insulating layer 17 over a wider area, i.e. also over voltage raising zones 9B, 9C farther away from the separation region. Several or all voltage raising zones 99 under the conductor track 25 are then short-circuited by the inversion channel. Since the voltage raising zones 9, 99 lie comparatively close together in practice, at approximately 3 μm from one another, charge transport between adjoining voltage raising zones 9, 99 is possible. Now if it is the first voltage raising zone 9A only which has no connection to breakdown voltage raising zones 99 situated below the conductor track 25, whereas further breakdown voltage raising zones 9B, 9C do have a connection to breakdown voltage raising zones 99B, 99C over which the conductor track 25 extends, a leakage current from back gate/source region 6, 5 to the semiconductor body 1 will nevertheless flow through the other voltage raising zones 9B, 9C, 99B, 99C, because charge can still reach the projecting portion 35 and the back gate region 5 through charge transport through zones 9B and 9C to zone 9A. However, when all voltage raising zones 9 between back gate 5 and drain region 8 have no connection to breakdown voltage raising zones 99 over which the conductor track 25 extends, then no leakage current between back gate/source region 5, 6 and semiconductor body 1 can occur, also at higher voltages in the drain region 8.

An additional advantage of the semiconductor device according to the invention is that a designer has a greater freedom. Thus the number and size of the breakdown voltage raising zones 99 under the conductor track 25 may be chosen independently of the number and size of the breakdown voltage raising zones 9 situated between back gate 5 and drain 8. In FIGS. 1, 2 and 3, furthermore, an extra breakdown voltage raising zone 99D is present between the drain region 8 and the separation region 15.

In a further embodiment, the lateral distance 60 between a breakdown voltage raising zone 9 situated between back gate 5 and drain region 8 and a breakdown voltage raising zone 99 over which the conductor track 25 extends is more than 5 μm, preferably 10 μm. It is found in practice that no or strongly reduced leakage currents occur which such a distance 60.

Preferably, a dielectric insulating layer and a conductive field plate 70 are provided at the surface between a breakdown voltage raising zone 9 situated between the back gate and the drain region and a breakdown voltage raising zone 99 over which the conductor track 25 extends, which field plate 70 is electrically connected to the source region 15 or to a gate electrode 18 situated above the channel region 7. The leakage current is found to be reduced even further then in practice. When the breakdown voltage raising zones 9 lies very close to the extension region 15B of the separation region 15, an insulating layer and a field plate 70 may also be provided between the extension region 15B and the breakdown voltage raising zones 9 so as to reduce the leakage current.

It is found in practice that the charge induced in the insulating layer 17 is present not only perpendicularly below the conductor track 25, but that it extends also in lateral direction. Preferably, the lateral distance 50 between a breakdown voltage raising zone 9 situated between back gate 5 and drain region 8 and an adjacent edge 26 of the conductor track 25 is more than 5 μm. Given such a distance 50, there is no connection between a breakdown voltage raising zone 9 situated between back gate 5 and drain region 8 and the inversion channel, so that no or strongly reduced leakage currents occur.

Preferably, the insulating layer 17 comprises silicon oxide. Problems involving leakage currents are found to occur especially when silicon oxide is used for the insulating layer 17. The measure according to the invention renders it possible to use a tried and tested material such as silicon oxide without leakage currents occurring in the semiconductor device.

Leakage current problems are encountered when the electric field in the insulating layer 17 exceeds a value of approximately 200 V/μm. This field occurs, for example, with 500 V across a 2.5 μm thick insulating layer. The measure according to the invention renders it possible to use such thin insulating layers, while problems involving leakage currents are nevertheless avoided.

The semiconductor device is used in practice in high-voltage applications. Additional measures not shown in the Figures may be taken in order to increase the suitability of the semiconductor device comprising the LDMOST for high voltages. Thus a dielectric layer, which may have various thicknesses and which is at least partly covered by a conductive field plate, may be present between the back gate 5 and the drain region 8 on the surface 2 above the breakdown voltage raising zones 9. Such a field plate is usually electrically connected to the gate electrode or the source connection. The field plate and the dielectric layer may be used for depleting the surface region 3 from the surface 2, so that at higher doping levels of the surface region, for example above $1\times10^{12}$ atoms/cm$^2$, nevertheless a complete depletion of the surface region 3 can be achieved locally before breakdown occurs in this region. In the low-side application, the effectiveness of the breakdown voltage raising zones 9 at the surface 2 according to the invention may yet be increased when the semiconductor device is provided with a buried breakdown voltage raising zone of the first conductivity type below the back gate region 5 with a concentration of dopant atoms which is higher than that of the semiconductor body 1, for example a p-type buried layer with a doping of $5\times10^{13}$ atoms/cm$^2$, at a boundary between the surface region 3 and the semiconductor body 1. The surface region 3 is then strongly depleted from below the back gate 5 through cooperation between the breakdown voltage raising zones 9 at the surface and the buried breakdown voltage raising zone, so that electric fields in the drift region 27 near the conduction channel 7 become weaker and breakdown of the surface region 3 will occur less readily. In addition, holes will be better discharged to the substrate 1 in the case of voltage changes at the drain region 8 in an n-channel LDMOST.

The invention is not limited to the embodiments described above. Thus, for example, a body of a different semiconductor material instead of a silicon semiconductor body may be used. The surface region 3 may be provided not only by epitaxial growth but also by diffusion or implantation. The conductivity types of the regions in the examples may also be reversed. A symmetrical construction was used in the examples, with a central drain region 8 provided on either side with back gate regions 5, so that the channel region 7 is divided into two channel halves 7A and 7B. It is obviously also possible to use the invention in an alternative construction of the LDMOST, for example, an asymmetrical construction.

I claim:

1. A semiconductor device of the RESURF type with a low-side lateral DMOST (LDMOST), comprising a semiconductor body of predominantly a first conductivity type and a surface region which adjoins a surface, which is of a second conductivity type opposed to the first, and which forms a first p-n junction with the semiconductor body at a side facing away from the surface, which LDMOST comprises a back gate region in the form of a surface zone of the first conductivity type provided in the surface region, with a source region in the form of a surface zone of the second conductivity type in the back gate region, and a channel region defined between the source region and an edge of the back gate region, and a drain region in the form of a surface zone of the second conductivity type situated at a distance from the back gate region, while a separation region of the first conductivity type is provided in the surface region around the LDMOST so as to adjoin the surface and extend towards the semiconductor body, and at least one first breakdown voltage raising zone of the first conductivity type is provided between the drain region and the back gate region and between the drain region and the separation region, which first breakdown voltage raising zone adjoins the surface, this surface being provided with an insulating layer on which a conductor track is provided which is connected to the drain region and which extends over at least one second voltage raising zone and the separation region, characterized in that at least one of the following zones: the zone forming the back gate region and the first breakdown voltage raising zone situated between the back gate and drain regions and situated most closely to the back gate region, is provided with at least one portion projecting towards the other zone at the area of which the distance between the two zones is smaller than in an adjoining portion of these zones, while the first breakdown voltage raising zone has no connection to said at least one second breakdown voltage raising zone over which the conductor track extends, each of said first and second breakdown voltage raising zones separating said drain region from said back gate region.

2. A semiconductor device as claimed in claim 1, characterized in that all first breakdown voltage raising zones situated between the back gate and the drain region have no connection to said second breakdown voltage raising zone over which the conductor track extends.

3. A semiconductor device as claimed in claim 1, characterized in that the lateral distance between a first breakdown voltage raising zone lying between the back gate and the drain region and a second breakdown voltage raising zone over which the conductor track extends is more than 5 µm.

4. A semiconductor device as claimed in claim 1, characterized in that the lateral distance between a first breakdown voltage raising zone lying between the back gate and the drain region and a second breakdown voltage raising zone over which the conductor track extends is approximately 10 µm.

5. A semiconductor device as claimed in claim 1, characterized in that a dielectric insulating layer and a conductive field plate are provided on the surface between a first breakdown voltage raising zone situated between the back gate and the drain region and a second breakdown voltage raising zone over which the conductor track extends, which field plate is electrically connected to the source region or to a gate electrode present above the channel region.

6. A semiconductor device as claimed in claim 1, characterized in that the lateral distance from a first breakdown voltage raising zone situated between the back gate and the drain region to an adjacent edge of the conductor track is more than 5 µm.

7. A semiconductor device as claimed in claim 1, characterized in that the insulating layer comprises silicon oxide.

\* \* \* \* \*